(12) United States Patent
Uh et al.

(10) Patent No.: US 7,629,260 B2
(45) Date of Patent: Dec. 8, 2009

(54) ORGANOSILANE HARDMASK COMPOSITIONS AND METHODS OF PRODUCING SEMICONDUCTOR DEVICES USING THE SAME

(75) Inventors: Dong Seon Uh, Seoul-si (KR); Hui Chan Yun, Kyeongsangnam-do (KR); Jin Kuk Lee, Kyeonggi-do (KR); Chang Il Oh, Kyeonggi-do (KR); Jong Seob Kim, Daejeon-si (KR); Sang-Kyun Kim, Kyeonggi-do (KR); Sang Hak Lim, Incheon-si (KR)

(73) Assignee: Cheil Industries, Inc. (KR)

( * ) Notice: Subject to any disclaimer, the term of this patent is extended or adjusted under 35 U.S.C. 154(b) by 280 days.

(21) Appl. No.: 11/608,451

(22) Filed: Dec. 8, 2006

(65) Prior Publication Data

US 2007/0224816 A1 Sep. 27, 2007

(30) Foreign Application Priority Data

Mar. 22, 2006 (KR) .................. 10-2006-0026211
Jun. 1, 2006 (KR) .................. 10-2006-0049341

(51) Int. Cl.
*H01L 21/302* (2006.01)
(52) U.S. Cl. .................. 438/717; 252/79.1; 438/706; 438/723; 438/633; 257/49; 430/270.1; 528/30; 528/43

(58) Field of Classification Search ............... 252/79.1; 438/706; 257/49; 430/270.1; 528/30; 428/447
See application file for complete search history.

(56) References Cited

U.S. PATENT DOCUMENTS

| 6,602,779 B1 * | 8/2003 | Li et al. ............ 438/622 |
| 7,288,282 B2 * | 10/2007 | Graham et al. ............ 427/142 |
| 2007/0185298 A1 * | 8/2007 | Baikerikar et al. ............ 528/31 |
| 2007/0212886 A1 | 9/2007 | Uh et al. |

FOREIGN PATENT DOCUMENTS

KR 2000-0077018 12/2000

* cited by examiner

*Primary Examiner*—Nadine Norton
*Assistant Examiner*—Maki Angadi
(74) *Attorney, Agent, or Firm*—Myers Bigel Sibley & Sajovec, PA

(57) ABSTRACT

Provided herein are hardmask compositions that include an organosilane polymer prepared by the reaction of one or more compounds of Formula (I)

$$Si(OR_1)(OR_2)(OR_3)R_4$$

wherein $R_1$, $R_2$ and $R_3$ may each independently be alkyl acetoxy or oxime; and $R_4$ may be hydrogen, alkyl, aryl or arylalkyl; and wherein the organosilane polymer has a polydispersity in a range of about 1.1 to about 2.

11 Claims, No Drawings

ORGANOSILANE HARDMASK COMPOSITIONS AND METHODS OF PRODUCING SEMICONDUCTOR DEVICES USING THE SAME

CLAIM OF PRIORITY

This application claims priority under 35 U.S.C. §119 to Korean Application Nos. 2006-26211 filed Mar. 22, 2006 and 2006-49341 filed Jun. 1, 2006, the contents of which are herein incorporated by reference in their entirety.

FIELD OF THE INVENTION

The present invention relates to hardmask compositions, and more particularly, to organosilane hardmask compositions for resist underlayer films. The present invention also relates to methods of producing semiconductor devices using organosilane hardmask compositions.

BACKGROUND OF THE INVENTION

For better resolution in lithographic processes, an antireflective coating (ARC) material may be used to minimize the reflectivity between an imaging layer, such as a photosensitive resist layer, and a substrate. However, because the resist layer often has a composition similar that of the ARC material, the ARC material may provide poor etch selectivity relative to the imaging layer. Accordingly, since large portions of the imaging layer may be removed during etching of the ARC material after patterning, additional patterning may be required in a subsequent etching step.

However, in some lithographic imaging processes, the resist material may not provide sufficient etch resistance to effectively transfer the desired pattern to a layer underlying the resist material. In actual applications, a so-called hardmask for a resist underlayer film may be applied as an intermediate layer between a patterned resist and the substrate to be patterned. For example, when an ultrathin-film resist material is used, the substrate to be etched is thick, a substantial etching depth is required, and/or the use of a particular etchant is required for a specific substrate, a hardmask for the resist underlayer may be desirable. The hardmask for a resist underlayer film may receive the pattern from the patterned resist layer and transfer the pattern to the substrate. The hardmask for a resist underlayer film should be able to withstand the etching processes needed to transfer the pattern to the underlying material.

For example, when a substrate, such as silicon, is processed, a resist pattern may be used as a mask. At this time, the resist may be micropatterned but with a decreased thickness. Thus, since the masking properties of the resist may be insufficient, processing of the substrate may result in damage to the substrate. Therefore, a process may be employed whereby a resist pattern is first transferred to an underlayer film (e.g., a hardmask) for the processing of the substrate, followed by dry etching of the substrate using the underlayer film as a mask. The underlayer film for the processing of the substrate refers to a film that may be formed under an antireflective film and may also function as an antireflective layer. In this process, the etching rate of the resist may be similar to that of the underlayer film for the processing of the substrate. Thus, it may be necessary to form a hardmask, which may also be antireflective, for processing the underlayer film between the resist and the underlayer film. As a consequence, a multilayer film consisting of the underlayer film for the processing of the substrate, the hardmask for processing the underlayer film and the resist may be formed on the substrate.

Various hardmask materials have been investigated. For example, Japanese Unexamined Patent Publication No. 2000-0077018 describes the use of polycondensation products of silane compounds of the general formula of $R_aSi(OR)_{4-a}$ in resist underlayer films. One problem associated with the use of such polycondensation products is that unreacted starting material and/or low molecular weight by-products obtained during the polycondensation may undesirably interact with a photoresist layer on the hardmask layer and result in deterioration of pattern characteristics.

Thus, it would be desirable to identify hardmask compositions and methods of using the same that minimize unreacted starting material or low-molecular weight byproducts in formed hardmask layers.

SUMMARY OF THE INVENTION

According to some embodiments of the present invention, hardmask compositions may include an organosilane polymer prepared by the reaction of one or more compounds of Formula I

$$Si(OR_1)(OR_2)(OR_3)R_4 \qquad (I)$$

wherein $R_1$, $R_2$ and $R_3$ may each independently be alkyl, acetoxy or oxime; and $R_4$ may be hydrogen, alkyl, aryl or arylalkyl; and wherein the organosilane polymer may have a polydispersity in a range of about 1.1 to about 2.

According to some embodiments of the present invention, the reaction of the one or more compounds of Formula (I) may be performed in the presence of an acid catalyst, such as nitric acid, sulfuric acid, p-toluenesulfonic acid monohydrate, diethyl sulfate, 2,4,4,6-tetrabromocyclohexadienone, benzoin tosylate, 2-nitrobenzyl tosylate and alkyl esters of organic sulfonic acids.

In addition, according to some embodiments of the invention, the organosilane polymer prepared by the reaction of the one or more compound of Formula (I) may have the structure of Formula (II)

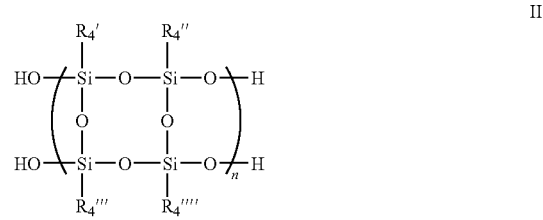

wherein $R_4'$, $R_4''$, $R_4'''$ and $R_4''''$ may each independently be hydrogen, alkyl, aryl or arylalkyl; and wherein the organosilane polymer may have a polydispersity in a range of about 1.1 to about 2.

Furthermore, according to some embodiments of the present invention, methods of forming semiconductor devices include forming a material layer on a substrate;

forming a organic hardmask layer on the material layer;

forming an antireflective hardmask layer from an antireflective hardmask composition according to an embodiment of the present invention on the organic hardmask layer;

forming a photosensitive imaging layer on the antireflective hardmask layer;

patternwise exposing the imaging layer to radiation to form a pattern of radiation-exposed regions in the imaging layer;

selectively removing portions of the imaging layer, the antireflective hardmask layer and the organic hardmask layer to expose portions of the material layer; and etching the exposed portions of the material layer to form a patterned material layer.

Also provided herein, according to some embodiments of the present invention, is a semiconductor integrated circuit device produced by a method according to an embodiment of the invention is provided.

DETAILED DESCRIPTION OF EMBODIMENTS OF THE INVENTION

The invention is described more fully hereinafter. This invention may, however, be embodied in many different forms and should not be construed as limited to the embodiments set forth herein. Rather, these embodiments are provided so that this disclosure will be thorough and complete, and will fully convey the scope of the invention to those skilled in the art.

It will be understood that when an element or layer is referred to as being "on," another element or layer, it can be directly on, connected to, or coupled to the other element or layer, or intervening elements or layers may be present. In contrast, when an element is referred to as being "directly on," "directly connected to," or "directly coupled to" another element or layer, there are no intervening elements or layers present. Like numbers refer to like elements throughout. As used herein, the term "and/or" includes any and all combinations of one or more of the associated listed items.

The terminology used herein is for the purpose of describing particular embodiments only and is not intended to be limiting of the invention. As used herein, the singular forms "a", "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Provided herein are hardmask compositions that may form hardmask layers having minimal unreacted starting material and low-molecular weight by-products, and thus, may improve the characteristics of photoresist patterns formed with such hardmask layers. While not wishing to be bound by any one theory, it is believed that the hydroxyl groups in the unreacted starting material and/or low-molecular weight byproducts may physically and/or chemically affect the properties of a photoresist layer in contact with the hardmask layer. It is believed that upon heating a hardmask film, unreacted starting material and low-molecular weight species tend to migrate to the surface of the film due to their low molecular weight. Thus, the unreacted starting material and/or low-molecular weight species may interact with the photoresist layer and may deteriorate the properties of the photoresist layer. This problem may become more serious at the thickness of the film increases.

Thus, according to embodiments of the present invention, purification may be performed after polycondensation to remove unreacted starting material and low-molecular weight byproducts, and a polymer having a relatively low polydispersity may be prepared. When such a polymer is used as a hardmask for a resist underlayer film, a desirable photoresist pattern may be formed.

As used herein:

The term "alkyl" refers to a monovalent straight, branched, or cyclic hydrocarbon radical having from 1 to 12 carbon atoms. In some embodiments, the alkyl may be a "lower alkyl," wherein the alkyl group has 1 to 4 hydrocarbons. For example, lower alkyl may include methyl, ethyl, propyl, iso-propyl, butyl, and iso-butyl. The term $C_x$ alkyl refers to an alkyl with x carbon atom(s), and thus, the term $C_1$-$C_6$ alkyl refers to any alkyl having from 1 to 6 carbon atoms.

The term "aryl" refers to a monovalent aromatic radical, which may optionally include 1 to 3 additional rings (e.g., cycloalkyl) fused thereto. An aryl ring may optionally be unsubstituted or substituted, for example, with one or more (e.g., one, two or three) of a halo, alkyl, aryl, and the like. Exemplary aryl groups may include phenyl, biphenyl, naphthyl, and the like.

The term arylalkyl refers to an alkyl radical, as defined herein, substituted with an aryl radical, as defined herein. Exemplary arylalkyl include phenylmethyl, phenylethyl, phenylpropyl, naphthylmethyl, and the like.

The term acetoxy refers to a —OC(=O)CH$_3$ radical.

The term oxime refers to —C=NOH radical.

In some embodiments of the invention, hardmask compositions may include an organosilane polymer prepared by the reaction of one or more compounds of Formula I

$$Si(OR_1)(OR_2)(OR_3)R_4 \qquad (I)$$

wherein $R_1$, $R_2$ and $R_3$ may each independently be alkyl, acetoxy or oxime; and $R_2$ may be hydrogen, alkyl, aryl or arylalkyl; and wherein the organosilane polymer may have a polydispersity in a range of about 1.1 to about 2. Furthermore, in some embodiments, $R_1$, $R_2$, $R_3$ and/or $R_4$ may be $C_1$-$C_5$ alkyl.

In some embodiments of the invention, a hardmask layer formed from a composition according to an embodiment of the invention is antireflective. In some embodiments of the invention, $R_4$ may be a phenyl group. The phenyl group may exhibit an absorption spectrum in the DUV region, which may be beneficial in forming an antireflective hardmask material. In addition, because the quantity of phenyl groups may be controlled by mixing a compound of Formula I, in which $R_4$ is phenyl with another compound of Formula I, wherein $R_4$ is a group that is not active in the DUV region, a hardmask composition with a desirable absorbance and refractive index at a particular wavelength may be provided.

In some embodiments of the present invention, a solvent, such as an organic solvent, may be included in the hardmask composition. A single solvent or a mixture of solvents may be used. When a mixture of two or more solvents is used, in some embodiments, one of the solvents is a high-boiling point solvent. The high-boiling point solvent may decrease or prevent the formation of voids and may allow the film to dry at a slower rate, which may improve the flatness of the film. As used herein, the term "high-boiling point solvent" refers to a solvent that may be evaporated at a temperature lower than the coating, drying and curing temperatures of the hardmask compositions according to the present invention.

In some embodiments of the present invention, the organosilane polymer may be prepared by the reaction of one or more compounds of Formula (I) in the presence of an acid catalyst. In some embodiments, the acid catalyst may include at least one of nitric acid, sulfuric acid, p-toluenesulfonic acid monohydrate, diethyl sulfate, 2,4,4,6-tetrabromocyclohexadienone, benzoin tosylate, 2-nitrobenzyl tosylate, and alkyl esters of organic sulfonic acids. The hydrolysis or polycondensation reaction forming the organosilane polymer may be suitably controlled by varying the type, amount and addition method of the acid catalyst.

In some embodiments of the invention, the organosilane polymer may be prepared by reacting one or more compounds of Formula I in an amount in a range of about 1 to about 99 parts by weight in the presence of an acid catalyst in an amount in a range of about 0.001 to about 5 parts by weight.

In some embodiments of the present invention, the organosilane polymer formed by the reaction of one or more of the compounds of Formula I may have the stricture of Formula II.

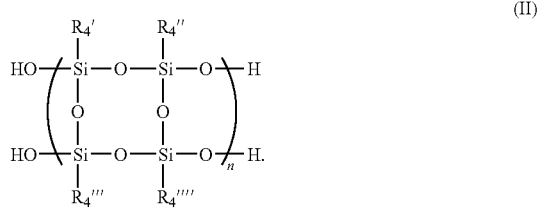

(II)

wherein $R_4$, namely $R_4'$, $R_4''$, $R_4'''$, and $R_4''''$, may be the same or different and may independently be a hydrogen, alkyl (e.g., $C_1$-$C_5$ alkyl), aryl or arylalkyl, and n may be a positive integer. For example, in some embodiments, $R_4'$ and $R_4''$ may be alkyl and $R_1'''$ and $R_4''''$ may be aryl. In addition, each repeating unit may include different $R_4$ groups, provided that each $R_4$ is hydrogen, alkyl, aryl or arylalkyl. Thus, in some repeating units of the organosilane represented by Formula II, $R_4'$ may be an alkyl, while in other repeating units $R_4'$ may be an aryl. Therefore, mixtures of different compounds of Formula I may be reacted to form the organosilane polymer of Formula II.

In some embodiments, the organosilane polymer may have a molecular weight in a range of about 1,000 to about 50,000 g/mol. In some embodiments, the organosilane polymer may have a molecular weight in a range of about 5,000 to about 30,000 g/mol. In some embodiments, the organosilane polymer may have a polydispersity in a range of about 1.1 to about 2.

In some embodiments of the invention, the organosilane polymer may be present in the hardmask composition in an amount in a range of about 1 to about 50 parts by weight, and in some embodiments, in an amount in a range of about 1 to about 30 parts by weight, based on 100 parts by weight of the hardmask composition.

If necessary, the hardmask compositions according to embodiments of the present invention may optionally include other suitable components, such as one or more of a crosslinking agent, radical stabilizer and a surfactant.

In some embodiments of the present invention, methods of forming semiconductor devices include (a) forming a material layer on a substrate; (b) forming a organic hardmask layer on the material layer; (c) forming an antireflective hardmask layer from an antireflective hardmask composition according to an embodiment of the invention on the organic hardmask layer; (d) forming a photosensitive imaging layer on the antireflective hardmask layer; (e) patternwise exposing the imaging layer to radiation to form a pattern of radiation-exposed regions in the imaging layer; (f) selectively removing portions of the imaging layer, the antireflective hardmask layer and the organic hardmask layer to expose portions of the material layer; and (h) etching the exposed portions of the material layer to form a patterned material layer. In some embodiments, the selectively removing portions of the imaging layer, the antireflective layer and organic hardmask layer may be performed by selectively removing portions of the imaging layer to expose portions of the antireflective hardmask layer, selectively removing portions of the antireflective hardmask layer to expose portions of the organic hardmask layer; and selectively removing portions of the organic hardmask layer to expose portions of the material layer.

In some embodiments of the invention, semiconductor integrated circuit devices produced by a method of the invention are provided.

The compositions and methods of the present invention may be used, for example, in the formation of patterned material layer structures, e.g., metal wiring lines, contact holes and biases, insulating sections, e.g., damascene trenches and shallow trench isolation, and trenches for capacitor structures, e.g., trenches used in the design of integrated circuit devices. The compositions and methods of the present invention may be particularly useful in the formation of patterned oxide, nitride, polysilicon and chromium oxides.

Hereinafter, the present invention will be more particularly explained with reference to the following examples. However, these examples are given for the purpose of illustration and are not to be construed as limiting the scope of the invention.

EXAMPLES

Preparative Example 1

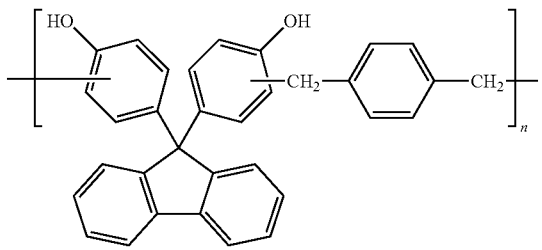

8.31 g (0.05 moles) of 1,4-bis(methoxymethyl)benzene, 0.154 g (0.001 moles) of diethyl sulfate, and 200 g of γ-butyrolactone were stirred in a one-liter four-neck flask equipped with a mechanical agitator, a condenser, a 300-ml dropping funnel, and a nitrogen feed tube for 10 minutes while nitrogen gas was supplied to the flask. A solution of 28.02 g (0.08 moles) of 4,4'-(9-fluorenylidene)diphenol in 200 g of γ-butyrolactone was slowly added dropwise for 30 minutes. The mixture was allowed to react for 12 hours. After completion of the reaction, the acid was removed using water, followed by concentration using an evaporator. Subsequently, the concentrate was diluted with MAK and methanol to obtain a 15 wt % solution in MAK/MeOH (4:1, w/w). The solution thus obtained was transferred to a 3-liter separatory funnel, and then n-heptane was added thereto to remove low-molecular weight compounds containing unreacted monomers, yielding the desired resin ($M_w$=12,000, polydispersity=2.0, n=23).

0.8 g of the resin, 0.2 g of an oligomeric crosslinking agent (Powderlink 1174) composed of the repeating structural unit shown below, and 2 mg of pyridinium p-toluenesulfonate were dissolved in 9 g of PGMEA, and filtered to prepare a sample solution.

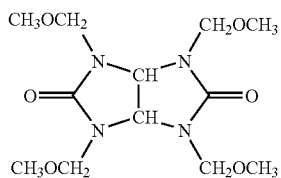

Structure of Powderlink 1174

The sample solution was spin-coated on a silicon wafer and baked at 200° C. for 60 seconds to produce a 1,500 Å-thick film.

Example 1

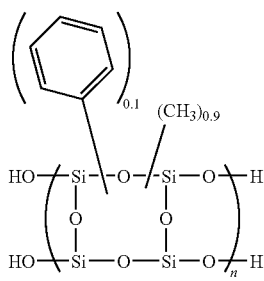

2,100 g of methyltrimethoxysilane and 340 g of phenyltrimethoxysilane were dissolved in 5,600 g of PGMEA in a 10-liter four-neck flask equipped with a mechanical agitator, a condenser, a dropping funnel and a nitrogen feed tube, and 925 g of an aqueous nitric acid (1,000 ppm) solution was added thereto. After the resulting solution was allowed to react at 60° C. for one hour, the formed methanol and a portion of the PGMEA were removed under reduced pressure. The reaction was continued for one week while maintaining the reaction temperature at 50° C. After completion of the reaction, an appropriate amount of hexane was added to the reaction solution to obtain a precipitate. The precipitate was filtered, redispersed in hexane and filtered again. The dispersion in hexane followed by filtration was repeated two more times to afford the desired polymer as a solid ($M_w$=15,000, polydispersity=1.50). 10 g of the polymer was dissolved in 100 g of PGMEA and 100 g of ethyl lactate to prepare a sample Solution.

The sample solution was spin-coated on the film produced in Preparative Example 1 and baked at 200° C. for 60 seconds to produce a 600 Å-thick film.

Example 2

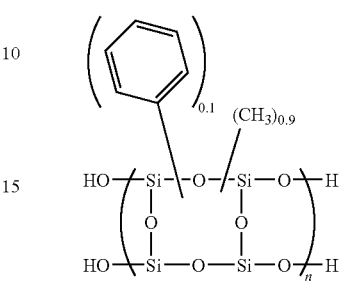

2,100 g of methyltrimethoxysilane and 340 g of phenyltrimethoxysilane were dissolved in 5,600 g of PGMEA in a 10-liter four-neck flask equipped with a mechanical agitator, a condenser, a dropping funnel and a nitrogen feed tube, and 925 g of an aqueous nitric acid (1,000 ppm) solution was added thereto. After the resulting solution was allowed to react at 60° C. for one hour, the formed methanol and a portion of the PGMEA were removed under reduced pressure. The reaction was continued for one week while maintaining the reaction temperature at 50° C. After completion of the reaction, an appropriate amount of hexane was added to the reaction solution to obtain a precipitate. The precipitate was filtered, redispersed in hexane and filtered again to afford the desired polymer as a solid ($M_w$=14,000, polydispersity=1.95). 10 g of the polymer was dissolved in 100 g of PGMEA and 100 g of ethyl lactate to prepare a sample solution.

The sample solution was spin-coated on the film produced in Preparative Example 1 and baked at 200° C. for 60 seconds to produce a 600 Å-thick film.

Comparative Example 1

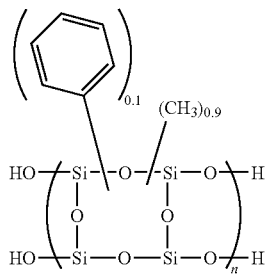

2,100 g of methyltrimethoxysilane and 340 g of phenyltrimethoxysilane were dissolved in 5,600 g of PGMEA in a 10-liter four-neck flask equipped with a mechanical agitator, a condenser, a dropping funnel and a nitrogen feed tube, and 925 g of an aqueous nitric acid (1,000 ppm) solution was added thereto. After the resulting solution was allowed to react at 60° C. for one hour, the formed methanol and a portion of the PGMEA were removed under reduced pressure. The reaction was continued for one week while maintaining the reaction temperature at 50° C. After completion of the reaction, an appropriate amount of hexane was added to the reaction solution to obtain a precipitate. The precipitate was isolated, but not redispersed in hexane, to afford the desired polymer as a solid ($M_w$=15,000, polydispersity=4.60). 10 g of the polymer was dissolved in 100 g of PGMEA and 100 g of ethyl lactate to prepare a sample solution.

The sample solution was spin-coated on the film produced in Preparative Example 1 and baked at 200° C. for 60 seconds to produce a 600 Å-thick film.

Each of the polymer solutions produced in Examples 1 and 2 and Comparative Example 1 was coated on a silicon wafer to produce films. The refractive index (n) and the extinction coefficient (k) of the films were measured using an ellipsometer (J. A. Woolam). The results are shown in Table 1.

TABLE 1

| Sample solutions used in formation of films | Optical properties (193 m) | | Optical properties (248 m) | |
| --- | --- | --- | --- | --- |
| | Refractive index (n) | Extinction coefficient (k) | Refractive index (n) | Extinction coefficient (k) |
| Example 1 | 1.71 | 0.23 | 1.53 | 0.00 |
| Example 2 | 1.70 | 0.22 | 1.54 | 0.00 |
| Comparative Example 1 | 1.71 | 0.22 | 1.54 | 0.00 |

A photoresist for ArF was coated on each of the wafers produced in Examples 1 and 2 and Comparative Example 1, baked at 110° C. for 60 seconds, exposed using an ArF exposure system (ASML 1250, FN70 5.0 active, NA 0.82), and developed with an aqueous TMAH (2.38 wt %) solution to form an 80-nm line and space pattern. The 80-nm line and space pattern was observed using an FE-SEM, and the obtained results are shown in Table 2. Exposure latitude (EL) margin according to the changes in exposure energy and depth of focus (DoF) margin according to the changes in the distance from a light source were measured. The results are shown in Table 2.

TABLE 2

| Samples used in formation of films | Pattern Characteristics | |
| --- | --- | --- |
| | EL margin (Δ mJ/exposure energy, mJ)) | DoF margin (μm) |
| Example 1 | 0.2 | 0.2 |
| Example 2 | 0.2 | 0.2 |
| Comparative Example 1 | 0.1 | 0.1 |

As apparent from the above description, the use of a hardmask composition according to an embodiment of the present invention may improve the pattern reproducibility, may adhere sufficiently to a resist, may be sufficiently resistant to a developing solution used after exposure of the resist, and may decrease film loss due to plasma etching.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A hardmask composition comprising
an organosilane polymer formed from monomers consisting of the compounds of Formula I $$Si(OR_1)(OR_2)(OR_3)R_4 \qquad (I)$$

wherein $R_1$, $R_2$ and $R_3$ are each independently selected from the group consisting of alkyl, acetoxy and oxime; and $R_4$ is selected from the group consisting of hydrogen, alkyl, aryl and arylalkyl; and
wherein the organosilane polymer has a polydispersity in a range of about 1.1 to about 2.

2. The hardmask composition according to claim 1, wherein $R_1$, $R_2$ and $R_3$ are each independently selected from the group consisting of $C_1$-$C_5$ alkyi, acetoxy and oxime; and $R_4$ is selected from the group consisting of hydrogen, $C_1$-$C_5$ alkyl, aryl and arylalkyl.

3. The hardmask composition according to claim 1, wherein the organosilane polymer is formed in the presence of an acid catalyst.

4. The hardmask composition according to claim 3, wherein the acid catalyst comprises at least one acid selected from the group consisting of nitric acid, sulfuric acid, p-toluenesulfonic acid monohydrate, diethyl sulfate, 2,4,4,6-tetrabromocyclohexadienone, benzoin tosylate, 2-nitrobenzyl tosylate and alkyl esters of organic sulfonic acids.

5. The hardmask composition according to claim 3, wherein the organosilane polymer is formed from monomers consisting of the compounds of Formula (I) in an amount in a range of about 1 to about 99 parts by weight in the presence of the acid catalyst in an amount in a range of about 0.001 to about 5 parts by weight.

6. The hardmask composition according to claim 1, wherein the organosilane polymer comprises the structure of Formula II

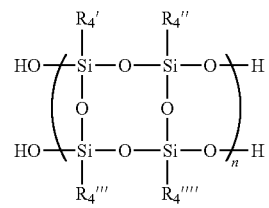

wherein $R_4'$, $R_4''$, $R_4'''$ and $R_4''''$ are each independently selected from the group consisting of hydrogen, alkyl, aryl and arylalkyl.

7. The hardmask composition according to claim 1, wherein the organosilane polymer has a molecular weight in a range of about 1,000 to about 50,000 g/mol.

8. The hardmask composition according to claim 1, further comprising an organic solvent.

9. A method of forming a semiconductor device comprising
forming a material layer on a substrate;
forming a organic hardmask layer on the material layer;
forming an antireflective hardmask layer from the antireflective hardmask composition according to claim 1 on the organic hardmask layer;
forming a photosensitive imaging layer on the antireflective hardmask layer;
patternwise exposing the imaging layer to radiation to form a pattern of radiation-exposed regions in the imaging layer;

selectively removing portions of the imaging layer, the antireflective hardmask and the organic hardmask layer to expose portions of the material layer; and etching the exposed portions of the material layer to form a patterned material layer.

10. The method according to claim 9, wherein selectively removing portions of the imaging layer, the antireflective hardmask layer and the organic hardmask layer comprises selectively removing portions of the imaging layer to expose portions of the antireflective hardmask layer, selectively removing portions of the antireflective hardmask layer to expose portions of the organic hardmask layer, and selectively removing portions of the organic hardmask layer to expose portions of the material layer.

11. A semiconductor integrated circuit device produced by the method according to claim 9.

* * * * *

UNITED STATES PATENT AND TRADEMARK OFFICE
CERTIFICATE OF CORRECTION

PATENT NO. : 7,629,260 B2  Page 1 of 1
APPLICATION NO. : 11/608451
DATED : December 8, 2009
INVENTOR(S) : Uh et al.

It is certified that error appears in the above-identified patent and that said Letters Patent is hereby corrected as shown below:

In the Claims:

Column 10, Claim 2, Line 15: Please correct "alkyi" to read -- alkyl --

Signed and Sealed this

Twenty-third Day of March, 2010

David J. Kappos
*Director of the United States Patent and Trademark Office*